(12) United States Patent
Epler et al.

(10) Patent No.: US 7,754,507 B2
(45) Date of Patent: Jul. 13, 2010

(54) METHOD OF REMOVING THE GROWTH SUBSTRATE OF A SEMICONDUCTOR LIGHT EMITTING DEVICE

(75) Inventors: John E. Epler, San Jose, CA (US); Oleg B. Shchekin, San Francisco, CA (US); Franklin J. Wall, Jr., Vacaville, CA (US); Jonathan J. Wierer, Jr., Pleasanton, CA (US); Ling Zhou, Dublin, CA (US)

(73) Assignees: Philips Lumileds Lighting Company, LLC; Koninklijke Philips Electronics N.V.

( * ) Notice: Subject to any disclaimer, the term of this patent is extended or adjusted under 35 U.S.C. 154(b) by 629 days.

(21) Appl. No.: 11/149,679

(22) Filed: Jun. 9, 2005

(65) Prior Publication Data
US 2006/0281203 A1    Dec. 14, 2006

(51) Int. Cl.
    H01L 21/00    (2006.01)
(52) U.S. Cl. .................... 438/26; 257/E21.511
(58) Field of Classification Search .......... 257/93, 257/95, 99; 438/26, 27, 28
    See application file for complete search history.

(56) References Cited

U.S. PATENT DOCUMENTS

| | | | |
|---|---|---|---|
| 5,376,580 A | 12/1994 | Kish et al. | |
| 5,779,924 A * | 7/1998 | Krames et al. | 216/24 |
| 6,410,943 B1 * | 6/2002 | Enquist | 257/97 |
| 6,455,878 B1 * | 9/2002 | Bhat et al. | 257/99 |
| 6,800,500 B2 | 10/2004 | Coman et al. | |
| 6,878,973 B2 * | 4/2005 | Lowery et al. | 257/100 |
| 7,098,530 B2 * | 8/2006 | Jansman et al. | 257/684 |
| 7,125,734 B2 * | 10/2006 | Sackrison et al. | 438/25 |
| 7,227,190 B2 * | 6/2007 | Yasukawa et al. | 257/79 |
| 7,294,862 B2 * | 11/2007 | Wierer et al. | 257/94 |
| 2002/0171087 A1 * | 11/2002 | Krames et al. | 257/81 |
| 2003/0071568 A1 * | 4/2003 | Lowery et al. | 313/512 |
| 2004/0077114 A1 * | 4/2004 | Coman et al. | 438/46 |
| 2004/0118599 A1 * | 6/2004 | Chason et al. | 174/260 |
| 2004/0262751 A1 * | 12/2004 | Lamola et al. | 257/734 |
| 2005/0023550 A1 | 2/2005 | Eliashevich et al. | |

(Continued)

FOREIGN PATENT DOCUMENTS

EP    1396891 A    3/2004

OTHER PUBLICATIONS

Bujard, thermal conductivity of molding compounds for plastic packaging, IEEE, 1994, 159-164.*

(Continued)

*Primary Examiner*—Mihn-Loan T. Tran
*Assistant Examiner*—Benjamin P Sandvik

(57) ABSTRACT

A semiconductor structure formed on a growth substrate and including a light emitting layer disposed between an n-type region and a p-type region is attached to a carrier by a connection that supports the semiconductor structure sufficiently to permit removal of the growth substrate. In some embodiments, the semiconductor structure is a flip chip device. The semiconductor structure may be attached to the carrier by, for example, a metal bond that supports almost the entire lateral extent of the semiconductor structure, or by interconnects such as solder or gold stud bumps. An underfill material which supports the semiconductor structure is introduced in any spaces between the interconnects. The underfill material may be a liquid that is cured to form a rigid structure. The growth substrate may then be removed without causing damage to the semiconductor structure.

20 Claims, 4 Drawing Sheets

U.S. PATENT DOCUMENTS

2005/0045901 A1* 3/2005 Wall, Jr. .................. 257/99
2006/0091409 A1* 5/2006 Epler et al. ................ 257/95
2006/0202223 A1* 9/2006 Sackrison et al. ........... 257/99

OTHER PUBLICATIONS

Rui Pu et al: "Hybrid Integration of VCSEL's to CMOS Integrated Circuits," IEEE Journal of Selected Topics in Quantum Electronics, IEEE Service Center, Piscataway, NJ, US, vol. 5, No. 2, Apr. 1999 (199-04), XP011062499, ISSN: 1077-260X, p. 202, left-hand column—p. 204, right-hand column; figures 1, 5.

Anonymous: "Technical Data Sheet Hysol FP4511," [on line] Dec. 2002, XP002421782, retrieved from the Internet: URL:http://tds.loctite.com/tds5/docs/H-FP4511-EN.PDF> [Retrieved on Feb. 23, 2007] the whole document.

International Search Report and Written Opinion, 18 pages.

EP Office Communication, 1 page.

* cited by examiner

METHOD OF REMOVING THE GROWTH SUBSTRATE OF A SEMICONDUCTOR LIGHT EMITTING DEVICE

BACKGROUND

1. Field of Invention

This invention relates to light emitting devices such as light emitting diodes (LEDs) and, in particular, to techniques for mounting LEDs for packaging and for removing the growth substrate of the LEDs.

2. Description of Related Art

Semiconductor light-emitting devices including light emitting diodes are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. Sapphire is often used as the growth substrate due to its wide commercial availability and relative ease of use. The stack grown on the growth substrate typically includes one or more n-type layers doped with, for example, Si, formed over the substrate, a light emitting or active region formed over the n-type layer or layers, and one or more p-type layers doped with, for example, Mg, formed over the active region.

Devices formed on conductive substrates may have the p- and n-contacts formed on opposite sides of the device. Often, III-nitride devices are fabricated on insulating or poorly conducting substrates with both contacts on the same side of the device. Such devices are often mounted so light is extracted through the growth substrate (known as a flip chip device).

III-nitride LED structures are often grown on sapphire substrates due to sapphire's high temperature stability and relative ease of production. In a flip chip device, the use of a sapphire substrate may lead to poor extraction efficiency due to the large difference in index of refraction at the interface between the semiconductor layers and the substrate. When light is incident on an interface between two materials, the difference in index of refraction determines how much light is totally internally reflected at that interface, and how much light is transmitted through it. The larger the difference in index of refraction, the more light is reflected. The refractive index of sapphire (1.8) is low compared to the refractive index of the III-nitride device layers (2.4) grown on the sapphire. Thus, a large portion of the light generated in the III-nitride device layers is reflected when it reaches the interface between the semiconductor layers and a sapphire substrate. To contribute to the output the reflected light must be scattered into the escape cone or reflect within the structure until it reaches the edge of the device where with small probability it may emerge as sidelight. The optical losses at the contacts and within the III-nitride device layers, e.g. free carrier absorption, significantly attenuate this trapped light before it escapes. Incorporation of an effective optical scatterer within the structure, preferably within the high index layer of the structure, increases the probability of the light being scattered into the escape cone before it is absorbed within the structure.

It is sometimes desirable to remove the growth substrate, for example, to improve the optical properties of the LED, or to gain electrical access to the LED layers. In the case of a sapphire substrate, removal may be by means of laser dissociation of GaN at the GaN/sapphire interface. In the case of Si or GaAs substrates, more conventional selective wet etches may be utilized to remove the substrate. Laser dissociation in particular generates shock waves in the semiconductor layers which can damage the semiconductor or metallization layers, potentially degrading the performance of the device.

Needed in the art are device designs and methods that facilitate substrate removal without damaging the semiconductor, that are compatible with available manufacturing techniques, and that enable advanced device designs.

SUMMARY

In accordance with embodiments of the invention, a semiconductor structure formed on a growth substrate and including a light emitting layer disposed between an n-type region and a p-type region is attached to a carrier by a connection that supports the semiconductor structure sufficiently to permit removal of the growth substrate. In some embodiments, the semiconductor structure is a III-nitride flip chip device. The semiconductor structure may be attached to the carrier by, for example, a metal bond that supports almost the entire lateral extent of the semiconductor structure, or by interconnects such as solder or gold stud bumps. An underfill material which supports the semiconductor structure is introduced in the space between the interconnects. In some embodiments, the underfill is a soft material such as a liquid that is introduced between the carrier and the semiconductor structure, then cured to form a rigid structure. The growth substrate may then be removed without causing damage to the semiconductor structure.

In some embodiments, after the growth substrate is removed, a wavelength converting material such as a phosphor is disposed on the surface of the semiconductor structure exposed by substrate removal. The underfill may be disposed along the sides of the semiconductor structure and the growth substrate, such that an enclosure is formed by the underfill remaining when the growth substrate is removed. The enclosure may contain the wavelength converting material. The underfill introduced between the semiconductor structure and the carrier, the underfill disposed along the sides of the semiconductor structure, and the wavelength converting material disposed on the top surface of the semiconductor structure form a seal which protects the semiconductor structure.

In some embodiments, after the growth substrate is removed, a photonic crystal is formed in the surface of the semiconductor structure exposed by substrate removal.

DETAILED DESCRIPTION

In accordance with embodiments of the invention, a semiconductor light emitting device is attached to a carrier by a connection that permits removal of the growth substrate. Though the examples below describe flip chip semiconductor light emitting device, embodiments of the invention may be applied to vertical semiconductor light emitting devices, where the first electrical contact is disposed on a bottom side of the semiconductor structure and the second contact is disposed on the top side of the semiconductor structure.

A standard epitaxial structure is first grown on a growth substrate. In III-nitride devices, an n-type region is typically grown first over the growth substrate. The n-type region may include multiple layers of different composition and dopant concentration, including, for example, preparation layers such as buffer layers or nucleation layers which may be n-type or not intentionally doped, release layers designed to facilitate release of the growth substrate or thinning of the epitaxial layers after substrate removal, and n-type device layers designed for particular optical or electrical properties desirable for the light emitting region to efficiently emit light. A light emitting or active region is then grown over the n-type region. The light emitting region may include one or more light emitting layers; multiple quantum well light emitting regions generally include multiple thin quantum well light emitting layers separated by barrier layers. A p-type region is then grown over the light emitting region. Like the n-type region, the p-type region may include multiple layers of different composition and dopant concentration.

After growth, the epitaxial structure may be processed into a flip chip by etching away one or more portions of the p-type and light emitting regions to expose a part of the n-type region. One or more metal layers, including, for example, ohmic contact layers, reflective layers, barrier layers, and bonding layers, are formed over the remaining portion of the p-type region and the exposed portion of the n-type region to form n- and p-contacts. After flip chip processing, a wafer of structures is diced into individual devices.

Figure 1:
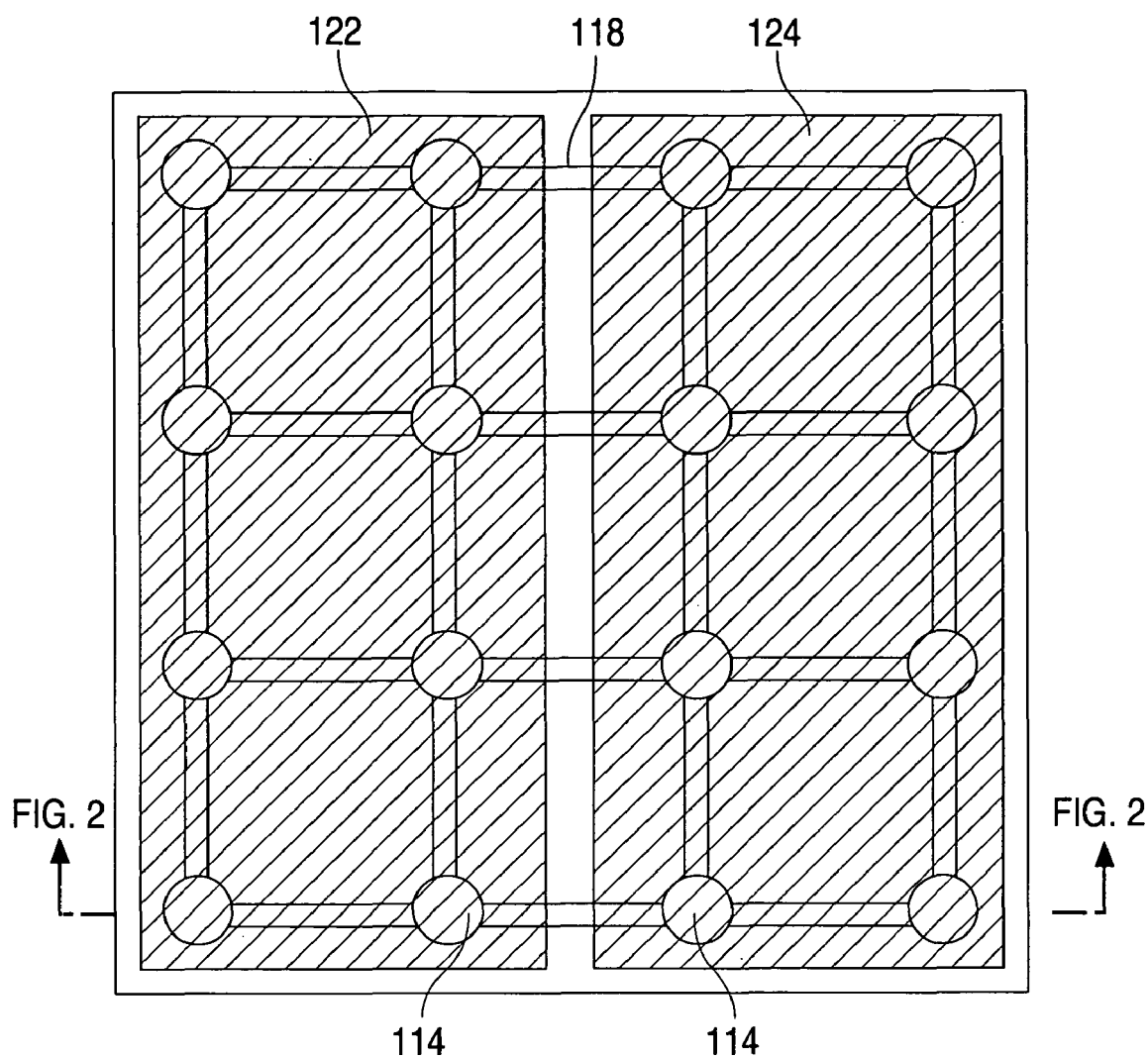
FIG. 1 is a plan view of a flip chip semiconductor light emitting device.
Figure 2:
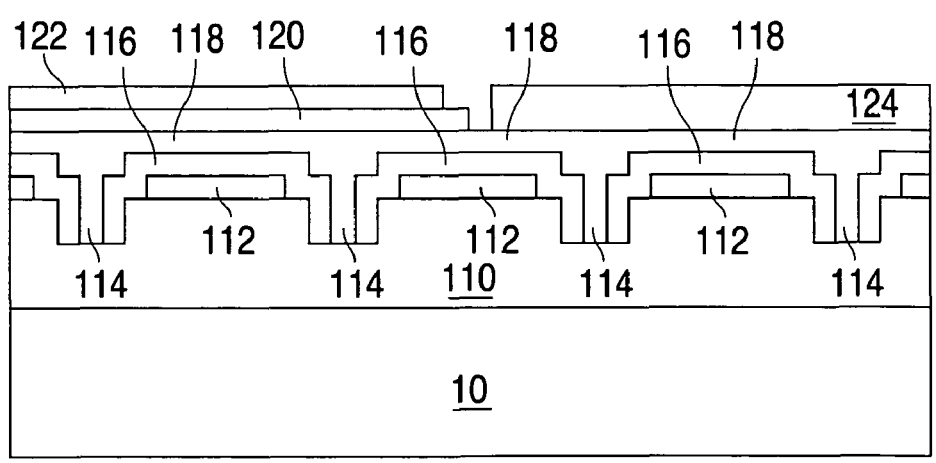
FIG. 2 is a cross sectional view of the device of FIG. 1.

FIG. 1 is a plan view and FIG. 2 is a cross sectional view of a portion of one example of an arrangement of contacts for a flip chip die. The device of FIGS. 1 and 2 is described in more detail in U.S. Pat. No. 6,828,586, which is assigned to the assignee of the present application and incorporated herein by this reference. The epitaxial structure described above is represented on FIG. 2 as epitaxial structure 110, grown on a growth substrate 10. Multiple vias are formed in which n-contacts 114 make electrical contact to the n-type region of epitaxial structure 110. P-contacts 112 are formed on the remaining portions of p-type region of epitaxial structure 110. The individual n-contacts 114 formed in the vias are electrically connected by conductive regions 118. The device may be flipped relative to the orientation illustrated in FIGS. 1 and 2 and mounted on a carrier (not shown) as described below. N-contacts 114 and conductive regions 118 make electrical contact to the carrier by n-connection region 124. Underneath n-connection region 124, the p-contacts 112 are isolated from n-contacts 114, conductive regions 118, and n-connection region 124 by dielectric 116. P-contacts 112 make electrical contact to the carrier by p-connection region 122. Underneath p-connection region 122, n-contacts 114 and conductive regions 118 are isolated from p-connection region 122 by dielectric 120. The device illustrated in FIGS. 1 and 2 is one example of a suitable flip chip device; it is to be understood that the invention may incorporate any flip chip device design, including multiple devices formed on a single growth substrate, or multiple dice attached to a single carrier.

Figure 3:
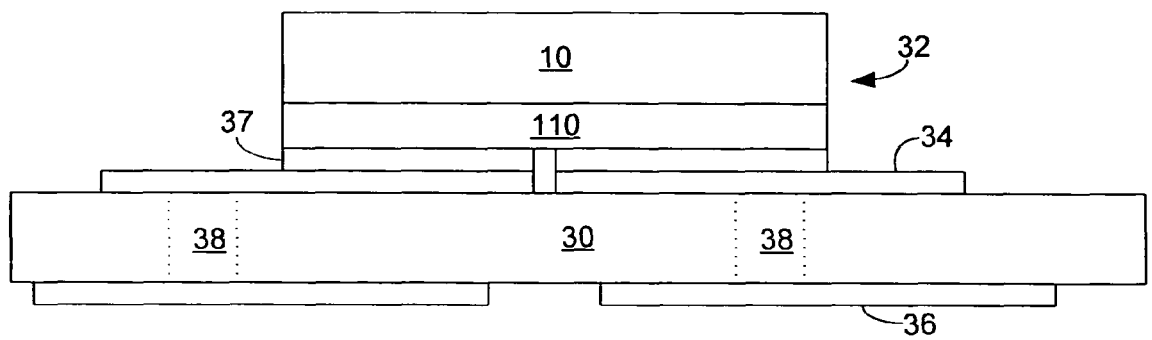
FIG. 3 is a cross sectional view of a flip chip semiconductor light emitting device attached to a carrier by a wafer bond.
Figure 4:
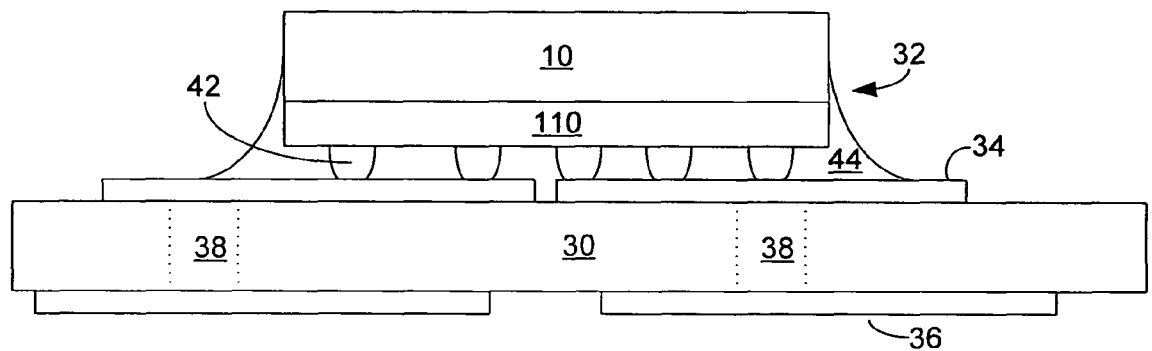
FIG. 4 is a cross sectional view of a flip chip semiconductor light emitting device attached to a carrier by underfill and interconnects such as gold-gold or solder interconnects.

One or more individual dice are then attached to a carrier. The carrier is preferably mechanically stable, thermally conductive, electrically insulating with effective conductive channels connecting contact areas, chemically inert, and inexpensive. Examples include AlN, alumina, and silicon. Alternatively, the carrier may be formed of an electrically conducting material if passivated to prevent shorting, such as anodized AlSiC. Carrier 30, as illustrated in FIGS. 3 and 4, may be formed in an array of carriers that are later separated. In some embodiments, in particular the embodiment described in reference to FIG. 4 where an underfill is used with a high temperature tolerant interconnect such as gold, carrier 30 may be formed of an electrically insulating material such as AlN or alumina, with contact pads 34, such as, for example, gold, connected to solderable electrodes 36 on the back side of the carrier using vias and/or metal traces 38. In some embodiments, in particular the embodiment described in reference FIG. 4 where an underfill is used with a low temperature interconnect such as indium tin solder, carrier 30 may be a silicon submount. In one embodiment, carrier 30 acts as a heat sink or conducts heat to a larger heat sink.

FIG. 3 illustrates a first example of a connection between carrier 30 and flip chip die 32. Die 32 is attached to contact pads 34 on carrier 30 by a bonding layer 37. Bonding layer 37 is typically metal such as gold or gold/tin. Bonding layer 37 is thinner than the thick interconnects described below in reference to FIG. 4. For example, bonding layer 37 is often less than 5 microns thick. Carrier 30 and die 32 may be bonded together under increased temperature and pressure. Bonding layer 37 covers as much of the surface of die 32 as possible, to provide support for epitaxial structure 110 to prevent epitaxial structure 110 from fracturing when substrate 10 is removed. In the case of a sapphire substrate removed by laser dissociation, since bonding layer 37 supports nearly the entire epitaxial structure, stress in the epitaxial structure during laser dissociation is reduced, potentially reducing damage including cracking caused during laser dissociation. In some embodiments, a transparent plate, such as a sapphire plate, may be pressed against the top surface of substrate 10 during laser dissociation to provide support to epitaxial structure 110. In some embodiments, thin bonding layers as illustrated in FIG. 3 are used in conjunction with underfill as illustrated in FIG. 4, to further support the die illustrated in FIG. 3.

FIG. 4 illustrates a second example of a connection between carrier 30 and flip chip die 32. In FIG. 4 die 32 is attached to carrier 30 by standard die attach techniques. For example, interconnects 42 may be a low temperature material such as indium tin solder for low power applications, or a high temperature material such as gold stud bumps bonded by an ultrasonic weld, for high power applications. An underfill material 44 is injected between carrier 30 and die 32 to provide support to epitaxial structure 110 during substrate removal. In the device illustrated in FIG. 4, a portion of semiconductor structure 110 is supported by interconnects 42, and a portion is supported by underfill 44. To prevent cracking when the semiconductor structure is exposed to stress, for example during substrate removal, the mechanical compliance and coefficient of thermal expansion of interconnects 42 and underfill 44 are preferably matched. For example, in some embodiments, the coefficient of thermal expansion of one of the interconnects and the underfill is no more than twice the coefficient of thermal expansion of the other. Examples of suitable underfill materials include FB4511 epoxy available from Henkel Corporation, and silicones and other epoxies loaded with inorganic materials such as silica or alumina to reach the desired coefficient of thermal expansion and mechanical compliance.

Since underfill 44 provides support for epitaxial layers 10, it is desirable for underfill 44 to fill all gaps between interconnects 42 and to avoid the formation of air bubbles which may encourage cracking of epitaxial structure 10 during substrate removal. Accordingly, the surface tension of the underfill material may be selected such that the underfill fills all gaps between interconnects 42. Alternatively, a partial vacuum may be created on a side of the gap between carrier 30 and die 32 opposite the side where the underfill is injected, to draw the underfill into all gaps between interconnects 42. Or, the underfill may be injected on carrier 30 or die 32 before connecting the die to the carrier by interconnects 42. After injection, the underfill is cured as appropriate to the underfill material, such that the underfill material provides a rigid structure between carrier 30, die 32, and interconnects 42. Though interconnect materials such as gold stud bumps can withstand the temperatures required for laser dissociation, some interconnect materials such as low temperature solder would liquefy at the temperatures required for laser dissociation, which would normally destroy the solder bond. In embodiments of the invention, the rigid underfill material confines the liquefied solder such that the solder bond is not compromised by the high temperature substrate removal process. In some embodiments, the underfill is not injected in a soft form then cured, rather it is formed on either carrier 30 or die 32 in a rigid form prior to connecting the die to the carrier by interconnects 42. For example, underfill 44 may be a dielectric layer formed on carrier 30 and patterned to form openings to accommodate interconnects 42. Die 32 is then aligned to interconnects 42 and connected to carrier 30 through interconnects 42.

Figure 5:
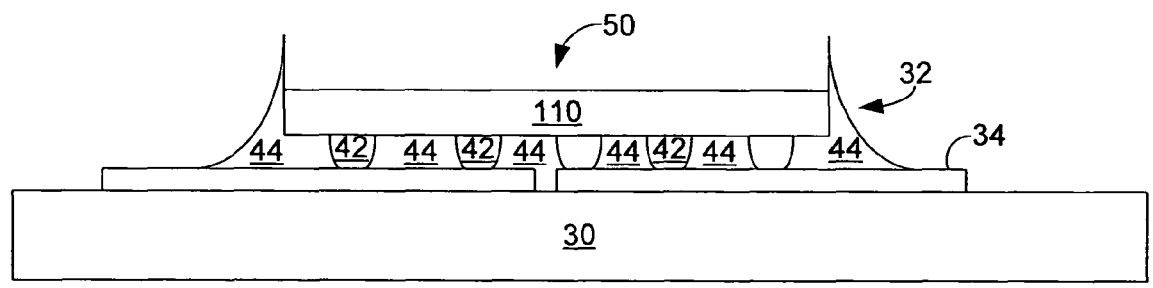
FIG. 5 is a cross sectional view of the device of FIG. 4 after the growth substrate is removed.

After attaching die 32 to carrier 30 as shown in FIGS. 3 and 4, substrate 10 of die 32 may be removed, leaving epitaxial structure 10 as illustrated in FIG. 5.

A sapphire substrate may be removed from a III-nitride epitaxial structure by laser dissociation by an excimer laser. The photon energy of the laser is selected to be above the band gap of the crystal layer adjacent to the sapphire (often GaN or AlGaN), thus the pulse energy is effectively converted to thermal energy within the first 100 nm of epitaxial material adjacent to the sapphire. At sufficiently high fluence and a photon energy above the band gap of the adjacent crystal layer and below the absorption edge of sapphire (i.e. between about 3.44 and about 6 eV), the temperature within the first 100 nm rises on a nanosecond scale to a temperature greater than 1000° C., high enough for the III-nitride material to dissociate into gallium and nitrogen gas, releasing the epitaxial layers 110 from substrate 10. Laser dissociation may be accomplished by a single laser exposure of the entire die surface, or a line scan across the surface. A line scan presents less stress during each exposure, as it exposes only a portion of the die at a time, permitting the use of a lower-energy exposure. If the pattern of the bonded area of the die includes unsupported areas as illustrated in FIG. 3, then the preferred orientation of the linescan is perpendicular to the orientation of the unsupported areas. The entire die is eventually exposed by multiple laser exposures.

Silicon-based (e.g., SiC, SiC-on-insulator, SiC-on-quartz, Si, etc.) substrates may be removed by conventional etching techniques, such as reactive ion etching. A SiC-on-insulator substrate may be removed by a liftoff technique that etches away an insulating layer between the growth substrate and the epitaxial layers. Similarly, in a device with an undercut etch layer grown in the epitaxial structure, a sapphire substrate may be removed by etching away the undercut etch layer. Finally, some growth substrates may be removed by lapping.

After the substrate is removed, the gallium metal left by laser dissociation may be cleaned with an aqueous solution of hydrochloric acid. The epitaxial layer may be thinned by dry etching, for example to remove low quality nucleation or buffer layers or to reach a desired thickness. The thinned layers may be roughened by, for example, photoelectrochemical etching to enhance light extraction from the light emitting region.

Figure 6:
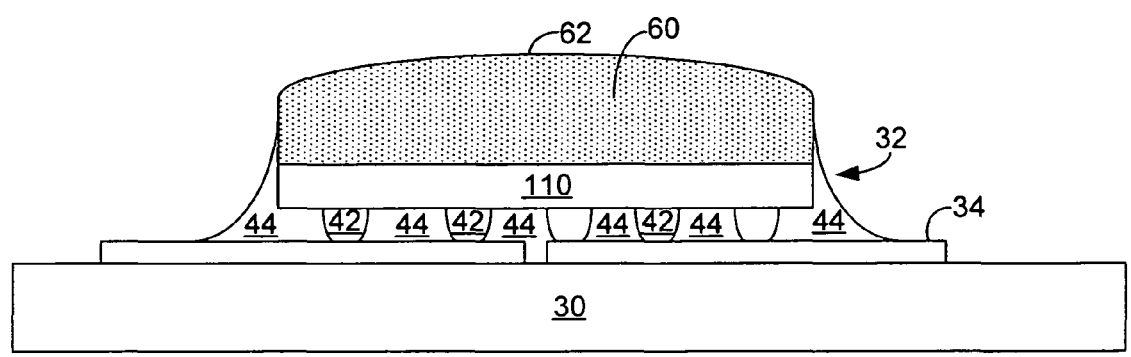
FIG. 6 is a cross sectional view of the device of FIG. 5 with a wavelength converting layer.

In some embodiments, a layer of wavelength converting material such as phosphor is disposed over epitaxial structure 110, as illustrated in FIG. 6. The wavelength converting material absorbs light emitted by the light emitting region of epitaxial structure 110 and reemits light of a longer wavelength. For example, a single phosphor that emits yellow light, or multiple phosphors that emit red and yellow-to-green light may be combined with a light emitting region that emits blue light, such that the composite of unconverted blue light leaking through the phosphor and light emitted by the phosphors appears white.

In one example, one or more phosphors 60 are disposed in a quantity of transparent material 62 such as silicone or epoxy, and the phosphor/transparent material mix is deposited over the top surface of epitaxial structure 110. The epoxy or silicone is then cured. As illustrated in FIG. 6, in the embodiment using an underfill illustrated above in FIG. 4 and accompanying text, the underfill material 44 may be applied to form a dam that extends up the sides of epitaxial structure 110 and substrate 10. When substrate 10 is removed, the remaining underfill material forms an enclosure that contains the phosphor/transparent material mix.

Such an arrangement offers several advantages. First, the epitaxial structure 110 is completely enclosed by underfill material 44 and transparent material 62, reducing the possibility of damage to or contamination of epitaxial structure 110. Second, the underfill material adjacent to the sides of epitaxial structure 110 blocks light from escaping from the device in these areas, meaning that all light escapes through the device through phosphor layer 60, potentially reducing or eliminating color variations in the composite light that are the result of side light escaping the device unconverted by phosphor layer 60. Third, the thickness of the phosphor layer can be controlled by controlling the height of the underfill material that forms the enclosure, potentially reducing or eliminating color variations in the composite light or color variations between devices resulting from variations in the thickness of the phosphor layer. Fourth, the volume of phosphor and transparent material used can be controlled, potentially reducing material waste.

In other examples, one or more phosphors are deposited by screen printing or electrophoretic deposition, as described in U.S. Pat. No. 6,576,488, which is assigned to the assignee of the present application and incorporated herein by this reference. In embodiments using multiple phosphors, the phosphors may be mixed and applied in a single layer, i.e. a single silicone layer or a single electrophoretically deposited layer, or the phosphors may be deposited as discrete layers, i.e. multiple silicone layers or multiple electrophoretic deposition steps.

Figure 7:
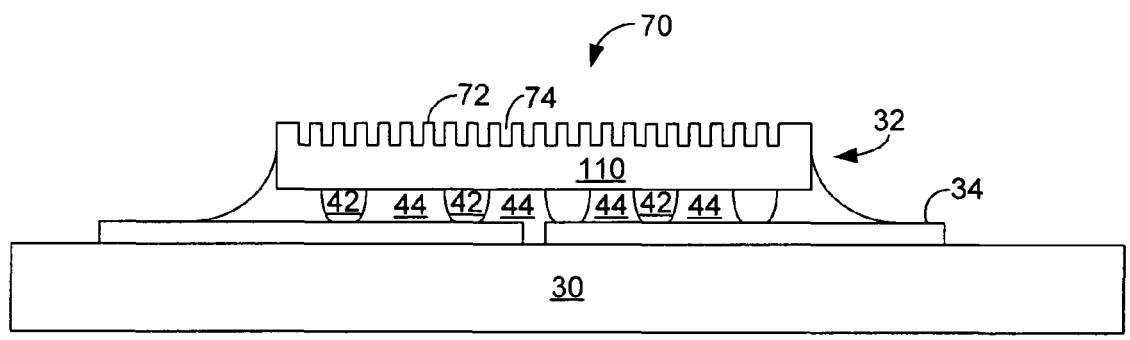
FIG. 7 is a cross sectional view of a device incorporating a photonic crystal.

In some embodiments, a photonic crystal 70 is formed in the exposed surface of epitaxial structure 110, as illustrated in FIG. 7. Photonic crystal 70 is created by forming a lattice of holes 74 separated by mesas 72 in epitaxial structure 110. The lattice of holes creates a medium with a periodically modulated dielectric constant, affecting the way light propagates through the medium. The photons of the light emitting diode can be characterized by their spectrum or dispersion relation, describing the relation between the energy and the wavelength of the photons. The relationship may be plotted, yielding a photonic band diagram consisting of energy bands, or photonic bands, separated by band gaps. Though the photonic band diagram is similar to the spectrum of electrons in crystalline lattices as expressed in an electronic band diagram, the photonic band diagram is unrelated to the electronic band diagram. When a photonic crystal is formed in a III-nitride LED, it affects how light propagates in epitaxial structure 110. Therefore if the proper lattice spacing is chosen, light that would otherwise have been trapped in the structure by total internal reflection can now escape, increasing the extraction of the LED. Also, alternative lattices can reduce the photon mode volume in the LED structure increasing the radiative rate or internal efficiency of the LED light emitting region.

The photonic crystal structure can include a periodic variation of the thickness of epitaxial region 110, with alternating maxima and minima. An example is a grating (one-dimensional lattice) or the planar lattice of holes 74 described above (two-dimensional lattice). The lattice is characterized by the diameter of the holes, d, the lattice constant a, which measures the distance between the centers of nearest neighbor holes, the depth of the holes w, and the dielectric constant of the dielectric, disposed in the holes, $\in_h$. Parameters a, d, w, and $\in_h$ influence the density of states of the bands, and in particular, the density of states at the band edges of the photonic crystal's spectrum. Parameters a, d, w, and $\in_h$ thus influence the radiation pattern emitted by the device, and can be selected to enhance the extraction efficiency from the device.

Holes 74 can be arranged to form, for example, triangular, square, hexagonal, honeycomb, or other two-dimensional lattice types. In some embodiments, different lattice types are formed in different regions of the device. Holes 74 can have circular, square, hexagonal, or other cross sections. In some embodiments, the lattice spacing a is between about $0.1\lambda$ and about $10\lambda$, preferably between about $0.1\lambda$ and about $4\lambda$, where $\lambda$ is the wavelength in the device of light emitted by the light emitting region. In some embodiments, holes 42 may have a diameter d between about 0.1 a and about 0.5 a, where a is the lattice constant. Holes 74 can be filled with air or with an optional dielectric (not shown) of dielectric constant $\in_h$, often between about 1 and about 16. Possible dielectrics include silicon oxides. Holes 74 may extend as close as possible to the light emitting region without penetrating the light emitting region, or may extend into or through the light emitting region into the p-type region.

Photonic crystals are often formed by nanometer-scale lithography techniques such as nano-imprinting lithography, interferometric lithography, and deep UV lithography. In the application of these wafer-scale processes in embodiments of the present invention, the "wafer" is a wafer of carriers, with individual LED dice attached to the carriers. Since these processes are wafer-scale, care must be taken to ensure that each LED die is at the same height. After individual dice are attached to individual carriers as illustrated in FIGS. 3 and 4, the height of the top surface of the growth substrate may vary by as much as tens of microns, due to variations in the interconnect and die attach process between individual dice.

In order to form the appropriate depth photonic crystal in each device, prior to underfilling each die and prior to removing the growth substrates, the die height may be made uniform. This may be accomplished by pressing together two optical flats, one pressed against the back side of the wafer of carriers, the other pressed against the top surfaces of the growth substrates attached to the carriers. The optical flats are pressed together, for example at a temperature less than 300° C. and a pressure less than 500 psi to make the die height uniform. The dice may then be underfilled and the substrates removed as described above.

Alternatively, the dice can be pressed flat after underfilling and after removing the substrate. This is advantageous to leveling before substrate removal because it ensures the top crystal surface of each die is at the same height, regardless of variations in the thickness of the substrates and the epitaxial structures between individual dice. Since the underfill is typically rigid when the substrate is removed, the amount of adjustment that can be made to the die height by pressing after substrate removal is limited. In some embodiments, the die height is adjusted both before and after substrate removal. Pressing before substrate removal reduces the size of the variation in die height, which may then be more finely adjusted by pressing again after substrate removal.

As described above, after substrate removal the epitaxial structure is optionally thinned using wet or dry etching processing. If thickness control is desired an undoped AlGaN layer or a p-type layer which acts as an etch stop layer during photoelectrochemical etching is grown at the desired thickness in the epitaxial structure.

Figure 8:
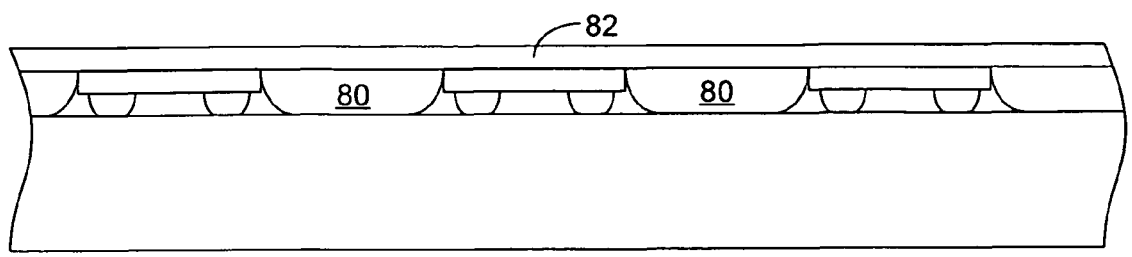
FIGS. 8 and 9 illustrate forming photoresist layers on a wafer of carriers.
Figure 9:
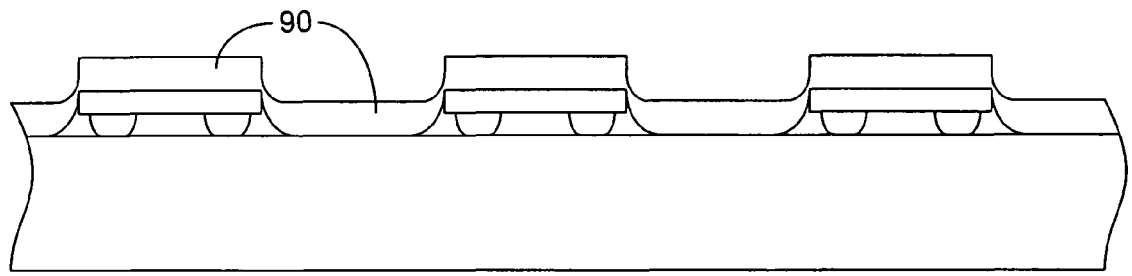

One or more photoresist layers are then deposited as illustrated in FIGS. 8 and 9. In FIG. 8, the spaces 80 between individual dice attached to a wafer of carriers are filled in with, for example, polyimide, silicone, epoxy, or photoresist to form a planar surface on which photoresist 82 can be spun-on or applied by any other suitable technique. In FIG. 9, photoresist layer 90 is sprayed or misted over individual dice attached to a wafer of carriers, such that a conformal layer of photoresist is formed. Multiple photoresist layers may be formed as required by the lithography technique used.

Figure 10:
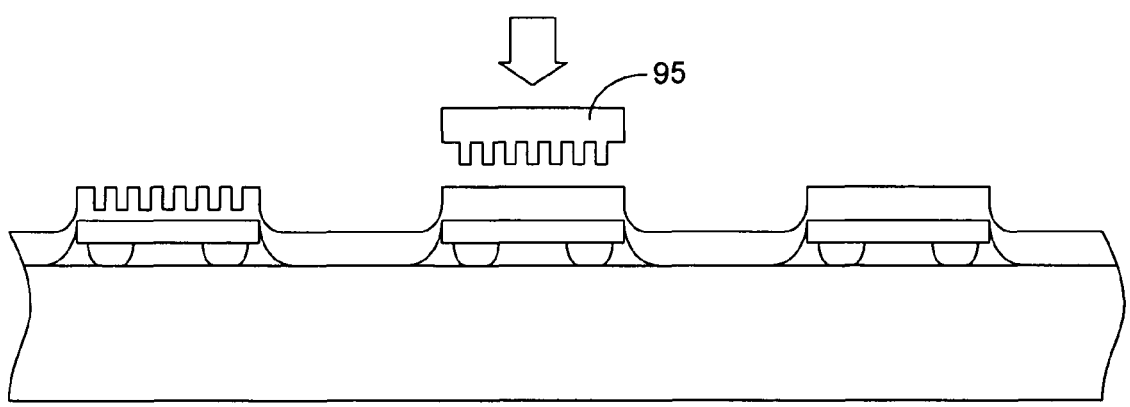
FIG. 10 illustrates stamping of photoresist on a wafer of carriers to form a mask to form a photonic crystal.

The photoresist layers are then patterned. Nano-imprinting lithography is illustrated in FIG. 10. The pattern of photonic crystal features are stamped into a top photoresist layer by stamping with a stamping block 95. As an alternative to the photoresist application techniques described above, such as spinning-on, spraying, or misting, for nano-imprinting lithography the resist layers may be deposited by dropping and stamping. Where a flat layer of resist is necessary, a blank stamp may be used. Where a patterned resist layer is necessary, a patterned stamp, as illustrated in FIG. 10, is used. Multiple photoresist layers are often used in nano-imprinting lithography, as the stamped photoresist is generally not very etch-resistant. For stamping to be successful, the stamped surface must be extremely flat. In contrast, interferometric lithography is less sensitive to die height. In interferometric lithography, the resist is exposed with interfering laser beams. In each of the above lithography techniques, the mask formed is used to etch directly into the surface of the epitaxial structure 110 to form the photonic crystal, or to etch into a hard mask layer, then into the epitaxial structure 110 to form the photonic crystal. The photoresist layers, hard mask layers, and material used to create a planar surface may then be removed.

Once any post-growth-substrate-removal processing is complete, a wafer of carriers 30 is diced using conventional techniques such as, for example, scribe-and-break or sawing. As described above, each carrier may contain one or more LEDs, either of the same color or of different colors. Each carrier may contain other circuitry, such as detectors, multiplexers, regulators, etc. The resulting carrier and attached LED die may be further processed by, for example, receiving an LED lens cap, mounting on a printed circuit board, etc.

The resulting structure has a very thin LED directly mounted on a carrier that typically extends beyond the boundaries of the LED. No other support substrate for the LED is required, thus eliminating the thermal and electrical resistance introduced by such a support substrate. Since the LED is very thin, there is little optical absorption by the layers. Light extraction features may be provided on the top layer surface, as described above. In the case of roughening the surface, high surface randomization is provided, and photons generated within the epitaxial layers experience a high frequency of randomizing events. The short path length between events and the absence of absorbing regions of epitaxial material (e.g., the absence of a low-temperature GaN nucleation layer and adjacent high defect density regions) may increase light extraction efficiency.

In some embodiments, the distance between the primary emission surface (the top surface) of the semiconductor structure and the carrier surface is less than 50 microns, although frequently the distance will be much less (e.g., 20 microns or less). The thickness of the semiconductor structure may be 10 microns or less and is often less than 4 microns.

Having described the invention in detail, those skilled in the art will appreciate that, given the present disclosure, modifications may be made to the invention without departing from the spirit of the inventive concept described herein. For example, though the above examples describe III-nitride devices, embodiments of the invention may use other material systems, including other III-V systems such as GaP-based devices or GaAs-based devices. Therefore, it is not intended that the scope of the invention be limited to the specific embodiments illustrated and described.

What is being claimed is:

1. A method comprising:
   providing a semiconductor structure grown on a growth substrate, the semiconductor structure comprising a light emitting layer disposed between an n-type region and a p-type region, wherein a plurality of vias are etched through the p-type region and light emitting layer to expose portions of the n-type region, a plurality of metal n-contacts are disposed in the plurality of vias, and a metal p-contact is disposed on at least a portion of the p-type region disposed between two of the plurality of vias;
   attaching the semiconductor structure to a carrier by at least one interconnect;
   introducing an underfill in a cavity between the semiconductor structure and the carrier, wherein the underfill provides a rigid support for the semiconductor structure; and
   removing the growth substrate;
   wherein the underfill provides a rigid support for the semiconductor structure during removal of the growth substrate.

2. The method of claim 1 wherein introducing an underfill comprises:
   disposing a liquid underfill material between the carrier and the semiconductor structure; and
   curing the liquid underfill material to form a rigid support for the semiconductor structure.

3. The method of claim 1 wherein introducing an underfill comprises:
   forming a rigid underfill layer on one of the semiconductor structure and the carrier prior to attaching; and
   forming at least one opening in the rigid underfill layer for the at least one interconnect.

4. The method of claim 1 wherein the at least one interconnect connects a metal layer formed on the carrier to one of an n-contact and the p-contact.

5. The method of claim 1 wherein:
   the at least one interconnect is coupled to a bottom surface of the semiconductor structure; and
   a top surface of the semiconductor structure is less than 50 microns from a top surface of the carrier.

6. The method of claim 1 wherein the underfill comprises an organic material.

7. The method of claim 1 wherein the underfill comprises an inorganic material.

8. The method of claim 1 wherein the underfill comprises epoxy.

9. The method of claim 1 wherein the underfill comprises silicone.

10. The method of claim 9 further comprising particles of inorganic material disposed in the silicone.

11. The method of claim 1 wherein:
    the at least one interconnect comprises gold; and
    attaching comprises attaching by ultrasonic welding.

12. The method of claim 1 wherein the at least one interconnect comprises solder.

13. The method of claim 1 wherein a coefficient of thermal expansion of one of the at least one interconnect and the underfill is no more than twice a coefficient of thermal expansion of the other of the at least one interconnect and the underfill.

14. The method of claim 1 wherein:
    the semiconductor structure is a III-nitride structure and the growth substrate is sapphire; and
    removing comprises removing by laser dissociation.

15. The method of claim 14 wherein removing by laser dissociation comprises scanning a surface of the growth substrate with a laser.

16. The method of claim 1 wherein removing comprises removing by etching.

17. The method of claim 1 further comprising thinning the semiconductor structure after removing the growth substrate.

18. The method of claim 17 wherein thinning comprises etching to an etch stop layer disposed within the semiconductor structure.

19. The method of claim 1 further comprising roughening a surface of the semiconductor structure exposed by removing the growth substrate.

20. The method of claim 1 wherein the growth substrate is sapphire and the underfill provides a rigid support for the semiconductor structure during laser dissociation of the sapphire growth substrate.

* * * * *